(12) United States Patent  (10) Patent No.: US 8,751,999 B2
Shibuya  (45) Date of Patent: Jun. 10, 2014

(54) COMPONENT PLACEMENT TOOL FOR PRINTED CIRCUIT BOARD

(75) Inventor: Toshiyuki Shibuya, Sunnyvale, CA (US)

(73) Assignee: Fujitsu Limited, Kawasaki-shi (JP)

( * ) Notice: Subject to any disclaimer, the term of this patent is extended or adjusted under 35 U.S.C. 154(b) by 120 days.

(21) Appl. No.: 13/176,310

(22) Filed: Jul. 5, 2011

(65) Prior Publication Data

US 2013/0014076 A1  Jan. 10, 2013

(51) Int. Cl.
   *G06F 17/50*  (2006.01)
(52) U.S. Cl.
   USPC ........... 716/137; 716/110; 716/111; 716/118; 716/119; 716/123
(58) Field of Classification Search
   CPC ............ G06F 17/5068; G06F 17/5072; G06F 17/5081
   USPC .................. 716/110–111, 118–119, 123, 137
   See application file for complete search history.

(56) References Cited

U.S. PATENT DOCUMENTS

| | | | | |
|---|---|---|---|---|
| 5,825,660 | A * | 10/1998 | Cagan et al. ................... | 703/2 |
| 7,149,994 | B1 * | 12/2006 | Dasasathyan et al. ........ | 716/122 |
| 7,313,778 | B1 * | 12/2007 | Stenz et al. ................... | 716/121 |
| 2002/0112220 | A1 * | 8/2002 | Miller ............................. | 716/10 |
| 2002/0116440 | A1 * | 8/2002 | Cohn et al. .................... | 709/105 |
| 2003/0130573 | A1 * | 7/2003 | Yu et al. ........................ | 600/407 |
| 2004/0088671 | A1 * | 5/2004 | Wu et al. ........................ | 716/16 |
| 2005/0028122 | A1 * | 2/2005 | Fallon et al. .................... | 716/10 |
| 2008/0168413 | A1 * | 7/2008 | Kakino et al. ................... | 716/9 |
| 2009/0087124 | A1 * | 4/2009 | Nord et al. ..................... | 382/296 |

OTHER PUBLICATIONS

Murata, H. et al., "VLSI/PCB Placement with Obstacles Based on Sequence-Pair," *IEEE Transactions on Computer-Aided Design of Integrated Circuits and Systems*, 17(1), Jan. 1998.
Murata, H. et al., "VLSI Module Placement Based on Rectangle-Packing by the Sequence-Pair," *IEEE Transactions on Computer-Aided Design of Integrated Circuits and Systems*, 15(12), Dec. 1996.
"FlowCAD," http://www.flowcad.ch/en/products/pcb/pcb-design-allegro/pcb-editor, downloaded Feb. 11, 2011.
Chang, Yun-Chih, "B*-Trees: A New Representation for Non-Slicing Floorplans," *DAC '00 Proceedings of the 37th Annual Design Automation Conference*, 2000.
Guo, Pei_Ning et al., "Floorplanning Using a Tree Representation," *IEEE Transactions on Computer-Aided Design of Integrated Circuits and Systems*, 20(2), Feb. 2001.
Nakatake, Shigetoshi et al., "Module Placement on BSG-Structure and IC Layout Applications," *ICCAD '96 Proceedings of the 1996 IEEE/ACM international conference on Computer-aided design*, 1996.

* cited by examiner

*Primary Examiner* — Paul Dinh
(74) *Attorney, Agent, or Firm* — Baker Botts L.L.P.

(57) ABSTRACT

In one embodiment, creating a layout for a Printed Circuit Board (PCB) by creating n boundary lines at n locations, respectively, on the PCB and placing n sets of electronic components on the n boundary lines, respectively; and iteratively adjusting and evaluating the layout of the PCB until a set of layout requirements for the PCB has been satisfied.

16 Claims, 7 Drawing Sheets

X, 1, H2, 2, V1, 3, 4, H3, 5, 6, 7, 8, H5, V3, H4, V2, H1

COMPONENT PLACEMENT TOOL FOR PRINTED CIRCUIT BOARD

TECHNICAL FIELD

This disclosure generally relates to Printed Circuit Board (PCB) layout.

BACKGROUND

A Printed Circuit Board, or PCB, is used to mechanically support and electrically connect electronic components using conductive channels, tracks, vias, or signal traces etched from metal (e.g., copper) sheets laminated onto a non-conductive substrate. Multiple electronic components may be placed on a PCB. The process of placing the component pads for the electronic components, traces, vias, and other board features on a PCB and creating the floor plan necessary to manufacture the PCB is generally referred to as PCB layout.

DESCRIPTION OF EXAMPLE EMBODIMENTS

A part of the PCB layout process involves creating a floor plan for placing multiple electronic components on a PCB. Often, the various electronic components placed on the same PCB may have different sizes, shapes, or design and performance requirements or constraints. In addition, there may be design or performance requirements or constrains for the PCB as a whole. Examples of these requirements or constraints may include, but not limited to: (1) component alignment (e.g., specific components may need to be lined up horizontally, vertically, or diagonally on the board), (2) component spacing (e.g., a specific amount of space may be required between components), (3) component location (e.g., specific components may need to be placed next to each other), (4) component number (e.g., a specific number of components may need to be placed on the same board), (5) heat air flow (e.g., air can flow efficiently through the PCB in order to cool down the components), (6) wire length matching (e.g., specific wires may be required to have the same length), (7) routability (e.g., all wires should be completely routed), (8) component implementability (e.g., sufficient margin for the manufacture of the PCB), and (9) cost minimization (e.g., minimizing the cost of manufacturing the PCB in terms of material, labor, or success rate).

Figure 1A:
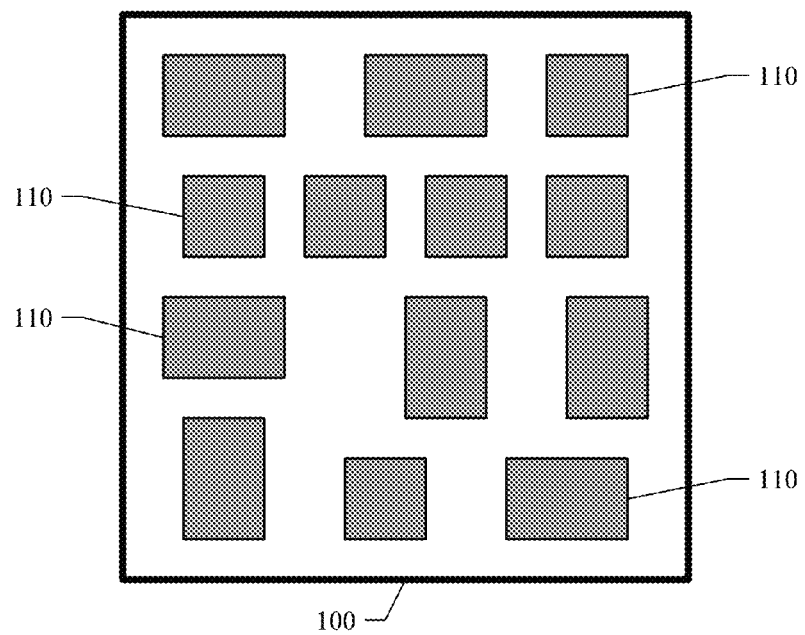
FIG. 1A illustrates the top view of an example PCB.
Figure 1B:
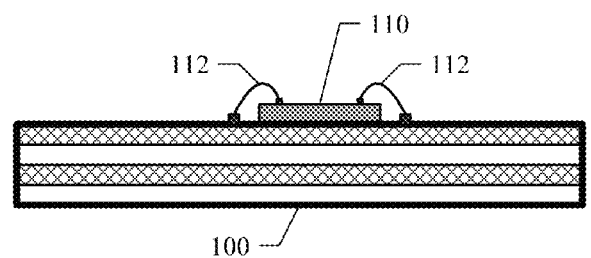
FIG. 1B illustrates the side view of an example PCB.

FIG. 1A illustrates the top view of an example PCB 100 having a number of electronic components 110 placed thereupon. Electronic components 110 may have different sizes and shapes, and may be distributed throughout PCB 100. An electronic component 110 may be connected to PCB 100 through a number of wires, or through solder bumps. FIG. 1B illustrates the side view of PCB 100 and an electronic component 110. A number of wires 112 may establish electrical connections between electronic component 110 and PCB 100.

Figure 2:
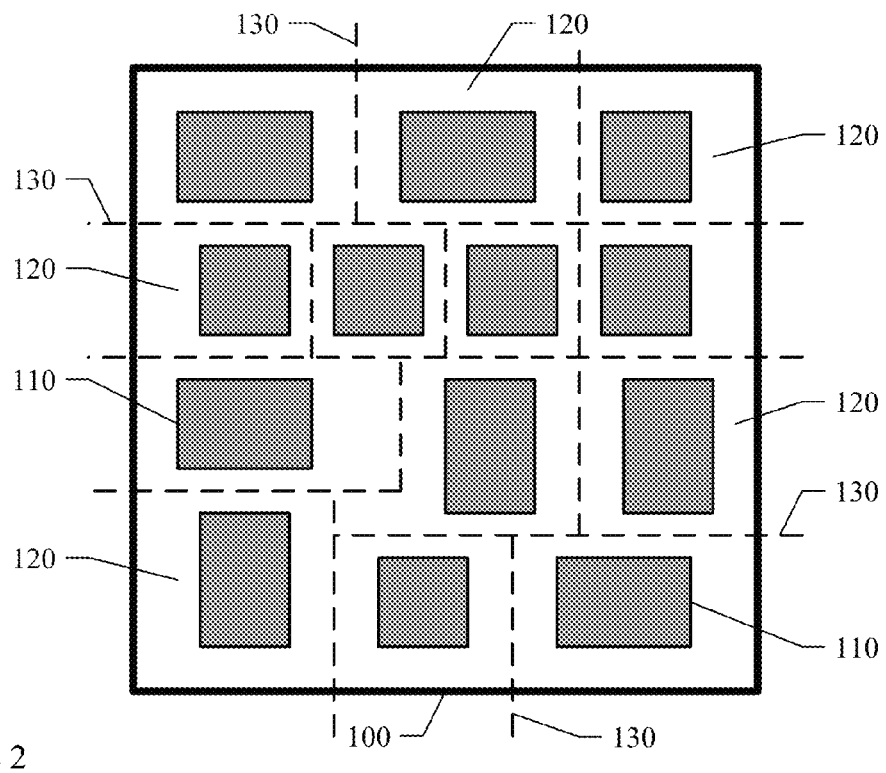
FIG. 2 illustrates an example PCB layout where electronic components are placed inside specific regions, as defined by boundary lines, on a PCB.

Traditionally, PCB layout has been done manually (e.g., by layout engineers or technicians). More recently, as the complexity of the PCBs increases, there are various computer-implemented tools (e.g., software applications) that help automate parts of the layout process. Some existing layout tools implement different optimization methods in order to improve the quality of the layouts; however, these optimization methods have various problems. For example, with a top-down layout process, a PCB is first divided into a few larger regions, and then each larger region is repeatedly divided into smaller and smaller regions, until the electronic components can be placed into the individual regions. FIG. 2 illustrates an example layout for PCB 100. In this case, PCB 100 is eventually divided into a number of relatively small regions 120. The boundary of each region 120 is marked by boundary lines 130. Different regions 120 may have different sizes or shapes in order to accommodate different electronic components 110, which are placed into suitable regions 120. With the top-down layout process, however, the latter process of optimization in top-down manner is mostly local (e.g., with respect to specific regions of the board) instead of global (e.g., with respect to the entire PCB as a whole). There is little flexibility, and it is often complicated and difficult to control the wire lengths and constraints, routing, and resources with fine-grin grids, because the earlier process should optimize with only rough information of the location of the components, which may have errors, and the latter process should follow the decision made by the earlier process. As another example, with a floor-planning-and-grid-placement layout process, there are too many iterations because if the floor plan is modified, the results of the grid placement in the previous phase (e.g., the previous floor plan) become invalid or obsolete. Some layout processes may work well with small and simple PCBs but have problems for larger and more complex PCBs, while others may lack support for various types of layout information and board features.

Figure 3A:
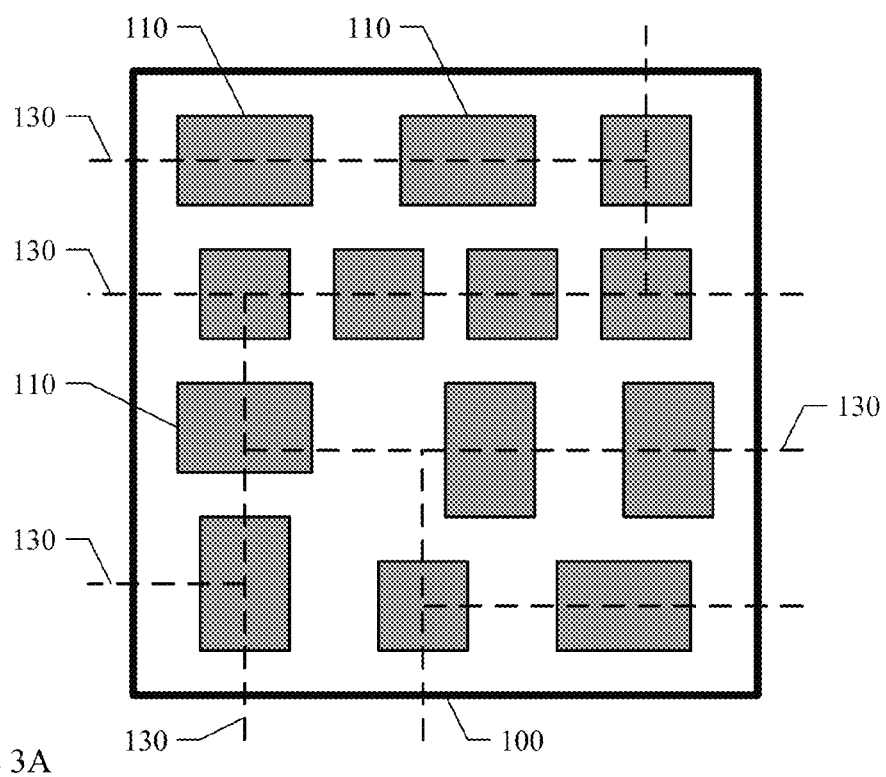
FIGS. 3A-3C illustrate examples of PCB layout where electronic components are placed on boundary lines on a PCB.

Particular embodiments provide a PCB layout process where electronic components are placed on the boundary lines, instead of inside the regions defined by the boundary lines, on a PCB. FIG. 3A illustrates an example layout of PCB 100. There are a number of boundary lines 130 (e.g., horizontal or vertical lines) dividing PCB 100 into a number of regions. However, in contrast to FIG. 2, electronic components 110 are placed on various boundary lines 130. Note that one or more electronic components 110 may be placed on the same horizontal or vertical boundary line 130.

Figure 3B:
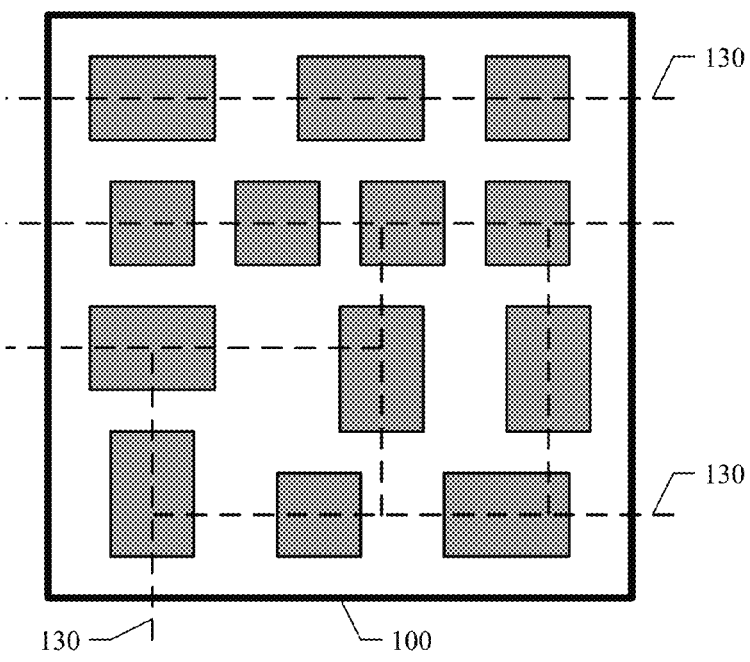
Figure 3C:
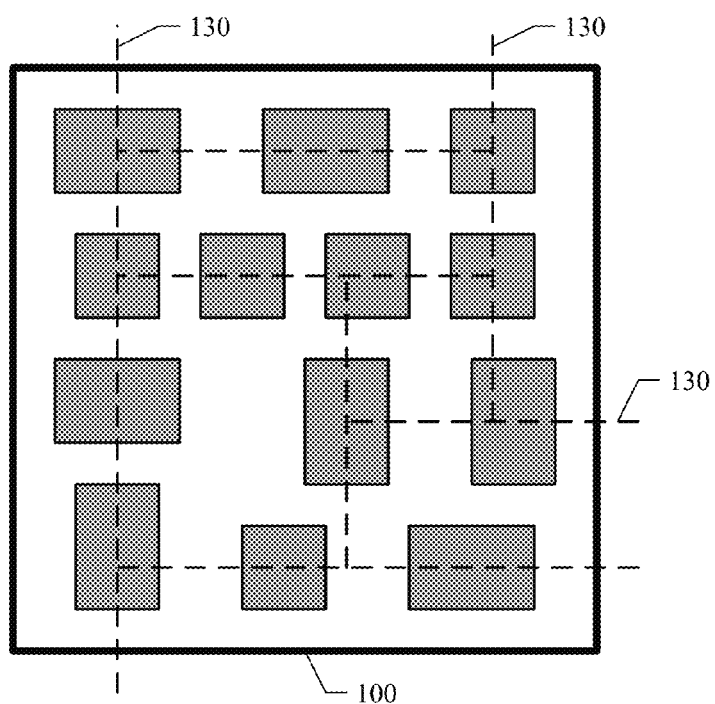

Given a specific PCB and a specific set of electronic components placed on the PCB, there may be different layouts for creating boundary lines on which the set of electronic components may be placed. For example, FIGS. 3B and 3C illustrate two alternative layouts of boundary lines 130 for PCB 100, which differ from the layout illustrated in FIG. 3A.

In particular embodiments, a layout of a PCB, as defined by a set of boundary lines (e.g., FIGS. 3A-3C), may be represented by a Slicing Tree, which is a binary tree suitable for representing a slicing floor plan. To briefly explain Slicing Trees in general, consider an example floor plan illustrated in FIG. 4. In this case, an area 400 is divided into seven regions 410 by six boundary lines 420, including four vertical boundary lines 420-1, 420-2, 420-3, 420-4 and two horizontal boundary lines 420-5, 420-6. Note that a horizontal boundary line separates a region vertically (e.g., separating the region into a top part and a bottom part), while a vertical boundary line separates a region horizontally (e.g., separating the region into a left part and a right part). Within an area, the number of regions defined by a set of boundary lines equals the number of boundary lines plus one. Thus, if there are n boundary lines, there are n+1 regions defined by the n boundary lines.

Figure 4:
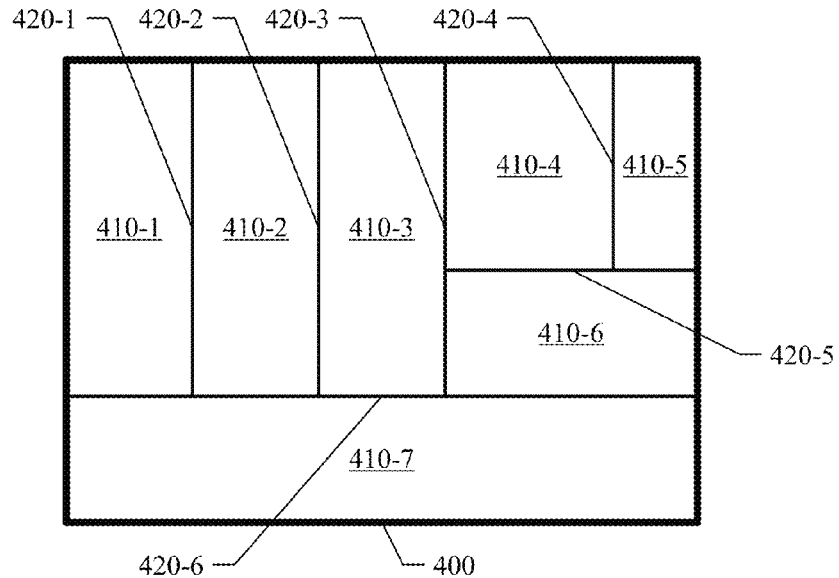
FIG. 4 illustrates an example floor plan.
Figure 5:
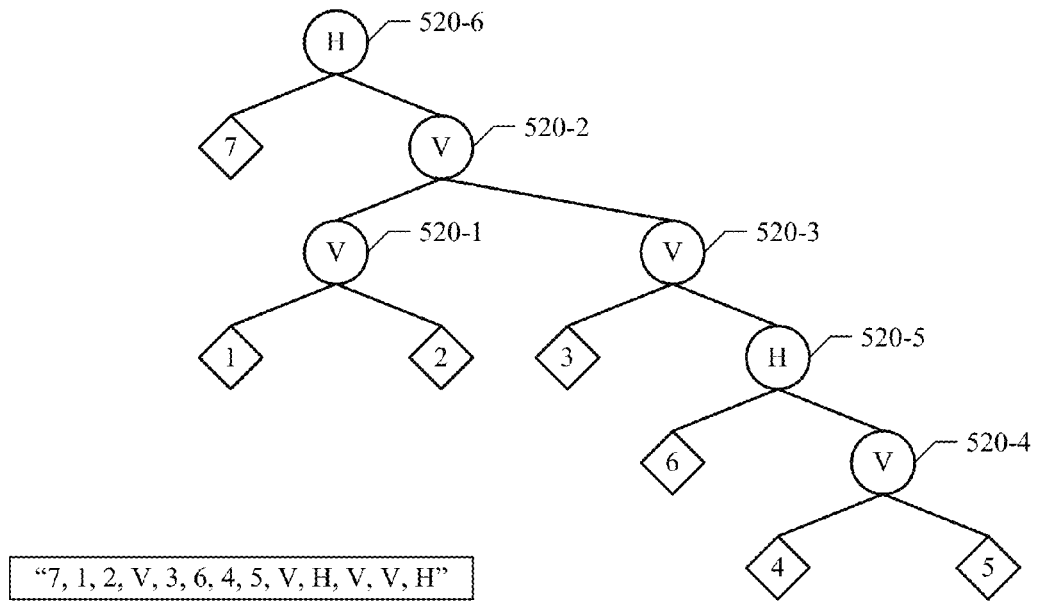
FIG. 5 illustrates an example Slicing Tree.

FIG. 5 illustrates an example Slicing Tree that represents the floor plan illustrated in FIG. 4. Each leaf node in FIG. 5, illustrated as a diamond-shaped node for easy readability, corresponds to a region 410 in FIG. 4, and each non-leaf node 520 in FIG. 5, illustrated as a circular-shaped node for easy readability, corresponds to a boundary line 420 in FIG. 4. Thus, the number of leaf nodes equals the number of non-leaf nodes plus one. More specifically, node 520-1 corresponds to vertical boundary line 420-1; node 520-2 corresponds to vertical boundary line 420-2; node 520-3 corresponds to vertical boundary line 420-3; node 520-4 corresponds to vertical boundary line 420-4; node 520-5 corresponds to horizontal boundary line 420-5; and node 520-5 corresponds to horizontal boundary line 420-5. Note that a specific floor plan may be represented by different variations of Slicing Trees.

In particular embodiments, for each non-leaf node corresponding to a specific boundary line, its two children are the two parts separated by the corresponding boundary line. For example, in FIG. 4, horizontal boundary line 420-6 separates area 400 into a top part and a bottom part. The top part includes regions 410-1 to 410-6 defined by boundary lines 420-1 to 420-5. The bottom part includes region 410-7. In FIG. 5, node 520-6 corresponds to horizontal boundary line 420-6. Its left child includes leaf node 7, which corresponds to region 410-7, and its right child includes leaf nodes 1-6 and non-leaf nodes 520-1 to 520-5, which correspond to regions 410-1 to 410-6 defined by boundary lines 420-1 to 420-5. As another example, in FIG. 4, vertical boundary line 420-4 separates regions 410-4 and 410-5. In FIG. 5, non-leaf node 520-4 corresponds to vertical boundary line 420-4. Its left child includes leaf node 4 corresponding to region 410-4; and its right child includes leaf node 5 corresponding to region 410-5. In particular embodiments, any slicing floor plan may be similarly represented by a suitable Slicing Tree.

Figure 6:
FIG. 6 illustrates an example Polish Expression representing a binary tree.

In particular embodiments, a Slicing Tree may be represented by a Polish Expression or Reverse Polish Expression, which is a form of logical, arithmetic, or algebraic expression. With a Polish Expression, each operator is placed to the left of its operands; and with a Reverse Polish Expression, each operator is placed to the right of its operands. FIG. 6 illustrates an example binary tree. Node Z has two children: X and Y, which may or may not be leaf nodes. To represent such a binary tree using a Polish Expression or Reverse Polish Expression, in particular embodiments, a parent (i.e., non-leaf) node is considered an operator, and its two children are considered the two operands of the operator. Thus, the Reverse Polish Expression representing the binary tree illustrated in FIG. 6 is "Polish(X), Polish (Y), Z". Note that the two children, X and Y, may or may not be leaf nodes. If a child is a leaf node, then its Polish Expression or Reverse Polish Expression is the value of the leaf node. If a child is a non-leaf node, then the same logic may be applied to obtain the Polish Expression or Reverse Polish Expression of the non-leaf node.

Similarly, the Slicing Tree illustrated in FIG. 5 may be represented by the Reverse Polish Expression "7, 1, 2, V, 3, 6, 4, 5, V, H, V, V, H". For easy readability, it may be clearer to divide this Reverse Polish Expression into segments using brackets (e.g., "[" and "]") as "[7, [[1, 2, V], [3, [6, [4, 5, V], H], V], V], H]". In this expression, the segment "[4, 5, V]" corresponds to node 520-4 and its two children "4" and "5", with "V" being the operator and "4" and "5" being the two operands. The segment "[6, [4, 5, V], H]" corresponds to node 520-5 and its two children "6" and "[4, 5, V]", with "H" being the operator and "6" and "[4, 5, V]" being the two operands. The segment "[3, [6, [4, 5, V], H], V]" corresponds to node 520-3 and its two children "3" and "[6, [4, 5, V], H]", with the last "V" being the operator. The segment "[1, 2, V]" corresponds to node 520-1 and its two children "1" and "2", with "V" being the operator and "1" and "2" being the two operands. The segment "[[1, 2, V], [3, [6, [4, 5, V], H], V], V]" corresponds to node 520-2 and its two children "[1, 2, V]" and "[3, [6, [4, 5, V], H], V]", with the last "V" being the operator. The whole expression "7, 1, 2, V, 3, 6, 4, 5, V, H, V, V, H" corresponds to node 520-6 (i.e., the root) and its two children "7" and "[[1, 2, V], [3, [6, [4, 5, V], H], V], V]", with the last "H" being the operator.

In case of a Polish Expression or Reverse Polish Expression representing a Slicing Tree, there are two types of operators: "V" corresponding to a vertical boundary line, and "H" corresponding to a horizontal boundary line. A skewed Slicing Tree corresponds to a Polish Expression or Reverse Polish Expression where no two consecutive operators (e.g., "H" or "V") in the expressions are of the same type.

Figure 7:
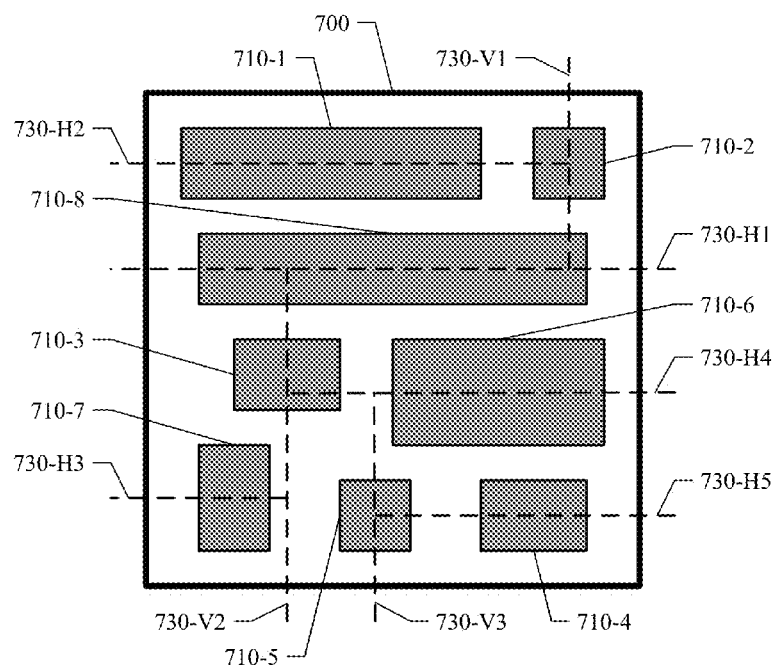
FIG. 7 illustrates an example PCB layout where electronic components are placed on boundary lines on a PCB.

As illustrated in FIGS. 3A-3C, a PCB may be divided into multiple regions with a set of boundary lines. In particular embodiments, one or more electronic components may be placed on each boundary line. FIG. 7 illustrates an example PCB 700. An example layout has been created for PCB 700 that includes five horizontal boundary lines 730-H1 to 730-H5 and three vertical boundary lines 730-V1 to 730-V3 (i.e., a total of eight boundary lines). A set of electronic components may be placed on each boundary line 730. In particular embodiments, each set of electronic components placed on a single boundary line 730 may include one or more electronic components. If there are n boundary lines, then there are n sets of electronic components. In the case illustrated in FIG. 7, there are eight boundary lines, and thus there are eight sets of electronic components 710-1 to 710-8.

Figure 8:
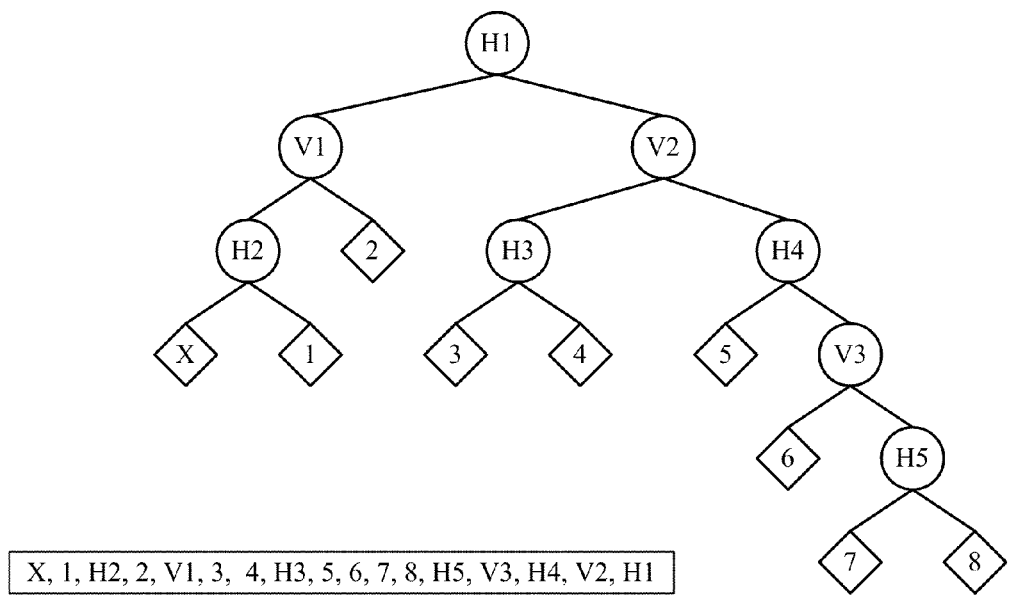
FIG. 8 illustrates an example Slicing Tree.

In particular embodiments, a PCB layout, such as the one illustrated in FIG. 7, may be represented by a Slicing Tree. FIG. 8 illustrates an example Slicing Tree that represents the layout illustrated in FIG. 7. Each non-leaf node in FIG. 8 corresponds to a horizontal or vertical boundary line 730 in FIG. 7 (e.g., node "H1" corresponds to horizontal boundary line 730-H1; node "V1" corresponds to vertical boundary line 730-V1; and so on). Each leaf node in FIG. 8, except one (i.e., node "X"), corresponds to a set of electronic components 710 placed on a boundary line 730 in FIG. 7 (e.g., node "1" corresponds to component set 710-1; node "2" corresponds to component set 710-2; and so on). As explained above, since a Slicing Tree is a binary tree used to represent a slicing floor plan, the number of leaf nodes equals the number of non-leaf nodes plus one. The non-leaf nodes correspond to the boundary lines, and the leaf nodes correspond to the sets of electronic components placed on the boundary lines. Since the number of sets of electronic components placed on the boundary lines necessarily equals the number of boundary lines, there is one leaf node in the Slicing Tree that does not correspond to a set of electronic components. In particular embodiments, this extra leaf node is considered a dummy node (e.g., a mere place holder). In FIG. 8, leaf node "X" is the dummy node that does not correspond to any set of electronic components.

In particular embodiments, a Slicing Tree may be represented by a Polish Expression or Reverse Polish Expression. For example, the Reverse Polish Expression representing the Slicking Tree illustrated in FIG. 8 is "X, 1, H2, 2, V1, 3, 4, H3, 5, 6, 7, 8, H5, V3, H4, V2, H1".

In particular embodiments, when a PCB layout is represented by a Slicing Tree, the layout may be modified by adjusting the positions of the nodes, leaf or non-leaf, in the Slicing Tree. Similarly, when a PCB layout is represented by a Polish Expression or Reverse Polish Expression, the layout may be modified by adjusting the positions of the operands or operators in the expression. For example, particular embodiments may (1) swap two adjacent operands in a Polish or Reverse Polish Expression, or swap two adjacent leaf nodes in a Slicing Tree; (2) take a chain of consecutive operators in a Polish or Reverse Polish Expression (e.g., HVHV) and complement it (e.g., VHVH); (3) swap an adjacent operator and operand while ensuring that the Slicing Tree remains a skewed tree.

Figure 9:
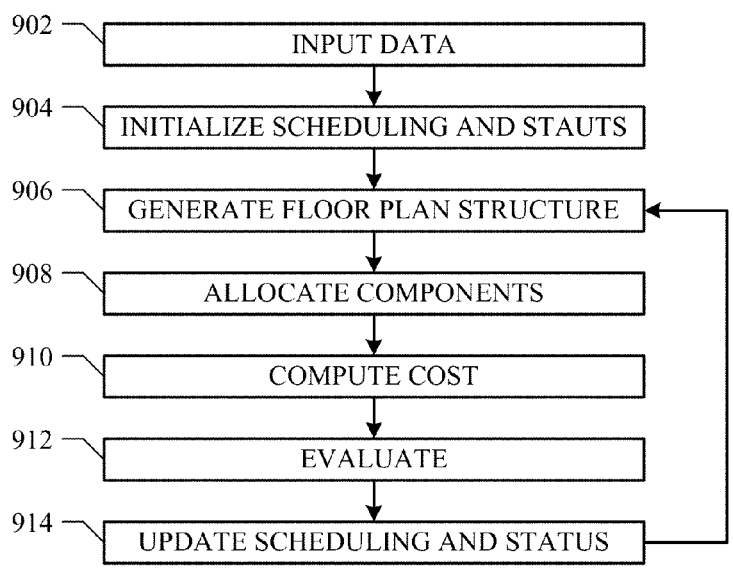
FIG. 9 illustrates an example method for automatically creating a PCB layout.

FIG. 9 illustrates an example method for automatically creating a PCB layout. In particular embodiments, to create a PCB layout, a number of electronic components need to be placed on a PCB, and a set of design or performance requirements or constraints need to be satisfied by the layout. Particular embodiments may receive input information or data, as illustrated in STEP 902, that describes (1) the PCB itself, which may include but not limited to the size, number of layers, and specific inhibits of the PCB; (2) the electronic components placed on the PCB, which may include but not limited to the name, identifier, size, type, and pin name list of each electronic component; (3) the net-list of the PCB, which may include, but not limited to connections, length limits, and other suitable design, performance, or manufacture requirements or constrains; and (4) any additional relevant information, if available. In particular embodiments, the input information may be stored in one or more data stores. Particular embodiments may obtain the input information from these data stores. Each type of information (e.g., PCB, electronic component, and net) may be represented using a suitable data structure.

Particular embodiments may divide the electronic components that need to be placed on the PCB into n sets, where each set may include one or more of the electronic components. Particular embodiments may create n boundary lines at n locations, respectively, on the PCB and place the n sets of components on the n boundary lines, respectively. There are various ways to place the n boundary lines, and thus the n sets of components, on the PCB. In particular embodiments, the initial n locations for the n boundary lines may be chosen randomly. The n boundary lines form a layout for the PCB with respect to the n sets of electronic components. Particular embodiments may represent the n boundary lines and the n sets of electronic components using a Slicing Tree or a Polish or Reverse Polish Expression, as described above.

Particular embodiments may then iteratively adjust the locations of one or more boundary lines, until a set of design, performance, or manufacture requirements or constrains for the layout is satisfied. Since a set of electronic components is placed on each boundary line, when a boundary line is moved from one location to another location on the PCB, the corresponding set of electronic components is also moved from the first location to the second locations.

In particular embodiments, the iterative process of adjusting the locations of the boundary lines, and thus the locations of the component sets, may be implemented based on Simulated Annealing (SA). SA is a generic probabilistic metaheuristic for the global optimization problem of locating a good approximation to the global optimum of a given function in a large search space.

Applying SA to the present iterative process, particular embodiments may initialize scheduling and status prior to starting the iterations, as illustrated in STEP 904. The following illustrates an example pseudo code for the initialization step:

```
// T_i is the initial temperature.
T_i = 100;
// T_f is the final temperature, which is
// the stopping condition for the iterative process.
T_f = 0;
// During each iteration, the current temperature
// is decreased by T_step.
T_step = 0.1;
// MCL is the length of Markov chains.
MCL = 100;
// MCL_current is the length of the current Markov chains.
MCL_current = 0;
[initialize the seed of random value generating function];
// P_best and C_best relate to the best layout solution
// for the PCB.
P_best = NULL;
C_best = INFINITY;
// P_current is the current Polish or Reverse Polish
// Expression representing the current layout of the
// PCB during each iteration.
P_current = [initial layout of the PCB];
```

In this example, "T_i", "T_f", and "T_step" are the three variables controlling the iterative process. When the process starts, the current temperature is "T_i". During each iteration, the current temperature is decreased by "T_step". The process stops when the current temperature reaches "T_f". During each iteration, the layout of the PCB may change as one or more of the n boundary lines may move to other locations on the PCB. The current layout of the PCB during each specific iteration is represented by "P_current". The best layout of the PCB is represented by "P_best", and the cost of the best layout of the PCB is represented by "C_best".

After initializing the variables, particular embodiments may start the iterative process. STEPS 906-914 may be repeated during each iteration.

During a specific iteration, particular embodiments may generate a floor plan structure, as illustrated in STEP 906. The floor plan is defined by the boundary lines and where these boundary lines are located on the PCB. Thus, when some of the boundary lines are moved (e.g., during a particular iteration), the floor plan changes. The floor plan, in fact, indicates the layout of the PCB. The current floor plan, or the current layout, of the PCB is represented by "P_current". The following illustrates an example pseudo code for the floor-plan-structure-generation step:

```
V = [read first vertex from P_current];
while (V != NULL) {
    If V == [leaf node] {        // V is a leaf node
        [push V into stack S1];
    } else {                     // V is a non-leaf node
        [push V into stack S2];
        if V == [vertical boundary line] {
            [create vertical slicing line at V.Ratio];
        } else {                 // V is horizontal boundary line
            [create horizontal slicing line at V.Ratio];
```

```
        }
    }
    V = [read next vertex from P_current];
}
```

In this example, the leaf nodes of the Slicing Tree represented by "P_current" are included in stack "S1", while the non-leaf nodes of the Slicing Tree represented by "P_current" are included in stack "S2".

Particular embodiments may allocate the electronic components, as illustrated in STEP 908. The following illustrates an example pseudo code for the component-allocation step:

```
// discard the dummy leaf node
[pop first vertex from S1];
V_leaf = [pop next vertex from S1];
while (V_leaf != NULL) {
    V_slice = [pop next vertex from S2];
    [allocate all components in CompGroupTable indexed by
    V_leaf.index];
    V_leaf = [pop next vertex from S1];
}
```

In this example, the variable "CompGroupTable" is used to store the n sets of electronic components (e.g., each set is a group).

Particular embodiments may compute the cost of the current layout, as illustrated in STEP 910. The following illustrates an example pseudo code for the cost-calculation step:

```
[execute routing estimation program to extract the cost of
wire length (C_w) and routing violation (C_v)];
[evaluate the constraints to extract the cost of
constraints (C_c)];
// compute the current cost for the current layout
C_current = C_w + C_v + C_c;
```

In this example, the cost variables "C_w", "C_v", and "C_c" relate to the design, performance, or manufacture requirements or constraints placed on the PCB layout, which may be included in the input data previously received during STEP 902. For example, "C_w" may relate to constraints such as wire length matching and differential wire length (e.g., the lengths of two different wires); and "C_v" may relate to routability requirements. The total cost is the sum of the individual types of costs.

Particular embodiments may evaluate the current layout, as illustrated in STEP 912. The following illustrates an example pseudo code for the evaluation step:

```
if (random( ) < A(C_best, C_current, T_i) {
    P_best = P_current;
    C_best = C_current;
    MCL = 0;
} else {
    MCL_current++;
}
```

In this example, "random( )" is a function that generates random values (recall that the seed for "random( )" has been initialized during the initialization step). The symbol "A" represents a function. In particular embodiments, "A" is defined as:

$$A(E, E', T) = \begin{cases} 1 & \text{if } \Delta E < 0 \\ e^{(-\frac{\Delta E}{T})} & \text{otherwise} \end{cases}$$

Particular embodiments may update the scheduling and status, as illustrated in STEP 914. The following illustrates an example pseudo code for the updating step:

```
if (MCL_current >= MCL) {
    MCL_current = 0;
    // Decrease the current temperature by "T_step".
    T_i = T_i - T_step;
}
if (T_i <= T_f) {
    // Current temperature is at or below "T_f";
    // end the iterative process.
    exit;
} else {
    [randomly choose one of the following operations and
    apply to P_current:
        (1) swap the order of two vertexes chosen
    randomly;
        (2) swap two sets of components chosen randomly;
        (3) move a component chosen randomly to a
    different set chosen randomly; and
        (4) change the ratio of a vertex chosen randomly
    to a random value between 0 and 1;
    ];
}
```

In this example, by applying one of the four operations to "P_current" during each iteration, the layout of the PCB is adjusted during each operation.

In the above example implementation, the iterative process, including STEPS 906-914, is repeated until the initial temperature "T_i" is gradually decreased, by the amount of "T_step" during each iteration, and reaches the final temperature "T_f". The layout represented by "P_best" and "C_best" obtained after completing the iterative process is the resulting layout for the PCB.

Figure 10:
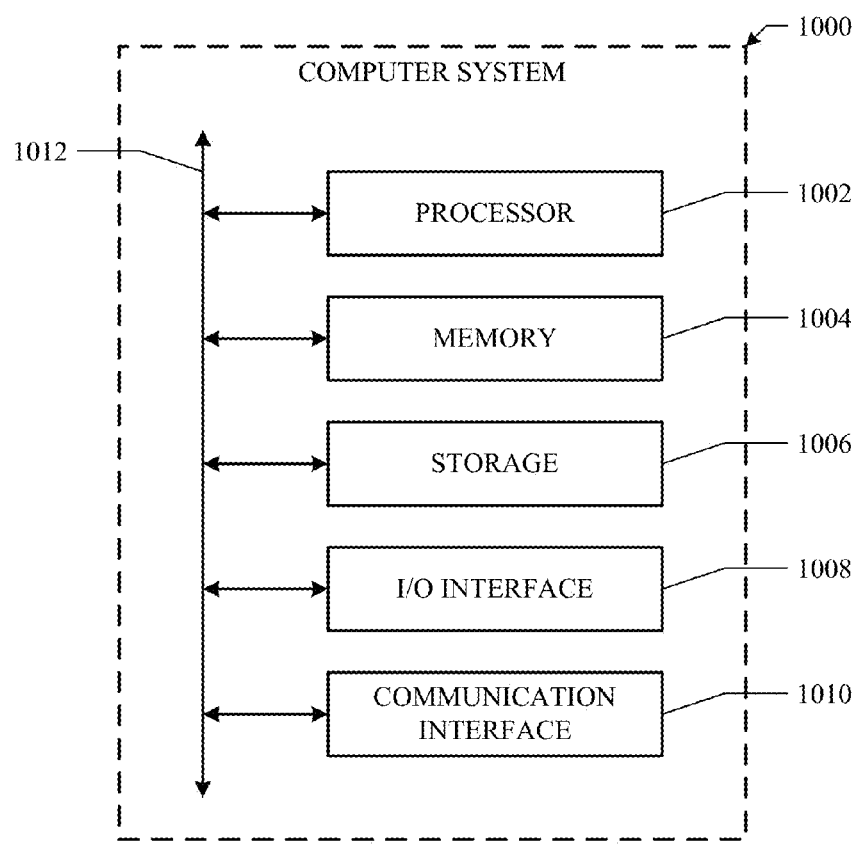
FIG. 10 illustrates an example computer system.

Particular embodiments may be implemented on one or more computer systems. For example, the PCB layout process illustrated in FIG. 9 may be implemented as computer software stored in non-transient computer-readable medium. FIG. 10 illustrates an example computer system 1000. In particular embodiments, one or more computer systems 1000 perform one or more steps of one or more methods described or illustrated herein. In particular embodiments, one or more computer systems 1000 provide functionality described or illustrated herein. In particular embodiments, software running on one or more computer systems 1000 performs one or more steps of one or more methods described or illustrated herein or provides functionality described or illustrated herein. Particular embodiments include one or more portions of one or more computer systems 1000.

This disclosure contemplates any suitable number of computer systems 1000. This disclosure contemplates computer system 1000 taking any suitable physical form. As example and not by way of limitation, computer system 1000 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 1000 may include one or more computer systems 1000; be unitary or distributed; span multiple locations; span multiple machines; or reside in a cloud, which may include one or more cloud components in one or more networks. Where appropriate, one or more computer systems 1000 may perform without substantial spatial or temporal limitation one or more steps of one or more methods described or illustrated herein. As an example and not by way of limitation, one or more computer systems 1000 may perform in real time or in batch mode one or more steps of one or more methods described or illustrated herein. One or more computer systems 1000 may perform at different times or at different locations one or more steps of one or more methods described or illustrated herein, where appropriate.

In particular embodiments, computer system 1000 includes a processor 1002, memory 1004, storage 1006, an input/output (I/O) interface 1008, a communication interface 1010, and a bus 1012. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1002 includes hardware for executing instructions, such as those making up a computer program. As an example and not by way of limitation, to execute instructions, processor 1002 may retrieve (or fetch) the instructions from an internal register, an internal cache, memory 1004, or storage 1006; decode and execute them; and then write one or more results to an internal register, an internal cache, memory 1004, or storage 1006. In particular embodiments, processor 1002 may include one or more internal caches for data, instructions, or addresses. This disclosure contemplates processor 1002 including any suitable number of any suitable internal caches, where appropriate. As an example and not by way of limitation, processor 1002 may include one or more instruction caches, one or more data caches, and one or more translation lookaside buffers (TLBs). Instructions in the instruction caches may be copies of instructions in memory 1004 or storage 1006, and the instruction caches may speed up retrieval of those instructions by processor 1002. Data in the data caches may be copies of data in memory 1004 or storage 1006 for instructions executing at processor 1002 to operate on; the results of previous instructions executed at processor 1002 for access by subsequent instructions executing at processor 1002 or for writing to memory 1004 or storage 1006; or other suitable data. The data caches may speed up read or write operations by processor 1002. The TLBs may speed up virtual-address translation for processor 1002. In particular embodiments, processor 1002 may include one or more internal registers for data, instructions, or addresses. This disclosure contemplates processor 1002 including any suitable number of any suitable internal registers, where appropriate. Where appropriate, processor 1002 may include one or more arithmetic logic units (ALUs); be a multi-core processor; or include one or more processors 1002. Although this disclosure describes and illustrates a particular processor, this disclosure contemplates any suitable processor.

In particular embodiments, memory 1004 includes main memory for storing instructions for processor 1002 to execute or data for processor 1002 to operate on. As an example and not by way of limitation, computer system 1000 may load instructions from storage 1006 or another source (such as, for example, another computer system 1000) to memory 1004. Processor 1002 may then load the instructions from memory 1004 to an internal register or internal cache. To execute the instructions, processor 1002 may retrieve the instructions from the internal register or internal cache and decode them. During or after execution of the instructions, processor 1002 may write one or more results (which may be intermediate or final results) to the internal register or internal cache. Processor 1002 may then write one or more of those results to memory 1004. In particular embodiments, processor 1002 executes only instructions in one or more internal registers or internal caches or in memory 1004 (as opposed to storage 1006 or elsewhere) and operates only on data in one or more internal registers or internal caches or in memory 1004 (as opposed to storage 1006 or elsewhere). One or more memory buses (which may each include an address bus and a data bus) may couple processor 1002 to memory 1004. Bus 1012 may include one or more memory buses, as described below. In particular embodiments, one or more memory management units (MMUs) reside between processor 1002 and memory 1004 and facilitate accesses to memory 1004 requested by processor 1002. In particular embodiments, memory 1004 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1004 may include one or more memories 1004, where appropriate. Although this disclosure describes and illustrates particular memory, this disclosure contemplates any suitable memory.

In particular embodiments, storage 1006 includes mass storage for data or instructions. As an example and not by way of limitation, storage 1006 may include an HDD, a floppy disk drive, flash memory, an optical disc, a magneto-optical disc, magnetic tape, or a Universal Serial Bus (USB) drive or a combination of two or more of these. Storage 1006 may include removable or non-removable (or fixed) media, where appropriate. Storage 1006 may be internal or external to computer system 1000, where appropriate. In particular embodiments, storage 1006 is non-volatile, solid-state memory. In particular embodiments, storage 1006 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1006 taking any suitable physical form. Storage 1006 may include one or more storage control units facilitating communication between processor 1002 and storage 1006, where appropriate. Where appropriate, storage 1006 may include one or more storages 1006. Although this disclosure describes and illustrates particular storage, this disclosure contemplates any suitable storage.

In particular embodiments, I/O interface 1008 includes hardware, software, or both providing one or more interfaces for communication between computer system 1000 and one or more I/O devices. Computer system 1000 may include one or more of these I/O devices, where appropriate. One or more of these I/O devices may enable communication between a person and computer system 1000. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1008 for them. Where appropriate, I/O interface 1008 may include one or more device or software drivers enabling processor 1002 to drive one or more of these I/O devices. I/O interface 1008 may include one or more I/O interfaces 1008, where appropriate. Although this disclosure describes and illustrates a particular I/O interface, this disclosure contemplates any suitable I/O interface.

In particular embodiments, communication interface 1010 includes hardware, software, or both providing one or more interfaces for communication (such as, for example, packet-based communication) between computer system 1000 and one or more other computer systems 1000 or one or more networks. As an example and not by way of limitation, communication interface 1010 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1010 for it. As an example and not by way of limitation, computer system 1000 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1000 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1000 may include any suitable communication interface 1010 for any of these networks, where appropriate. Communication interface 1010 may include one or more communication interfaces 1010, where appropriate. Although this disclosure describes and illustrates a particular communication interface, this disclosure contemplates any suitable communication interface.

In particular embodiments, bus 1012 includes hardware, software, or both coupling components of computer system 1000 to each other. As an example and not by way of limitation, bus 1012 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, or another suitable bus or a combination of two or more of these. Bus 1012 may include one or more buses 1012, where appropriate. Although this disclosure describes and illustrates a particular bus, this disclosure contemplates any suitable bus or interconnect.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

This disclosure contemplates one or more computer-readable storage media implementing any suitable storage. In particular embodiments, a computer-readable storage medium implements one or more portions of processor 1002 (such as, for example, one or more internal registers or caches), one or more portions of memory 1004, one or more portions of storage 1006, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody software. Herein, reference to software may encompass one or more applications, bytecode, one or more computer programs, one or more executables, one or more instructions, logic, machine code, one or more scripts, or source code, and vice versa, where appropriate. In particular embodiments, software includes one or more application programming interfaces (APIs). This disclosure contemplates any suitable software written or otherwise expressed in any suitable programming language or combination of programming languages. In particular embodiments, software is expressed as source code or object code. In particular embodiments, software is expressed in a higher-level programming language, such as, for example, C, Perl, or a suitable extension thereof. In particular embodiments, software is expressed in a lower-level programming language, such as assembly language (or machine code). In particular embodiments, software is expressed in JAVA, C, or C++. In particular embodiments, software is expressed in Hyper Text Markup Language (HTML), Extensible Markup Language (XML), or other suitable markup language.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising: by one or more computing devices,
   creating a layout for a Printed Circuit Board (PCB), comprising:
      creating n boundary lines at n locations, respectively, on the PCB; and
      randomly placing n sets of electronic components on the n boundary lines, respectively; and
   iteratively adjusting and evaluating the layout of the PCB until a set of layout requirements for the PCB has been satisfied, and
   wherein for iteratively evaluating the layout of the PCB, each iteration comprises:
   computing a cost of the layout of the PCB based on the set of layout requirements;
   generating, by a random value generating function, a random value;
   computing a value to evaluate a currently best layout of the PCB, the value computed based on at least a cost of the currently best layout of the PCB and a current temperature controlling the iterative process; and
   if the random value is less than the value, then:
      setting the currently best layout of the PCB as the layout of the PCB; and
      setting the cost of the currently best layout of the PCB as cost of the layout of the PCB.

2. The method of claim 1, further comprising representing the layout of the PCB with a Slicing Tree.

3. The method of claim 1, further comprising representing the layout of the PCB with a Polish Expression or Reverse Polish Expression.

4. The method of claim 1, wherein iteratively adjusting and evaluating the layout of the PCB is based on Simulated Annealing, such that the iterative process is controlled by a temperature, comprising:
   setting the temperature to an initial value;
   decreasing the temperature by a step value during each iteration; and
   ending the iterative process when the temperature reaches a final value.

5. The method of claim 1, wherein for iteratively adjusting the layout of the PCB, each iteration comprises randomly performing one of:
   swapping two randomly selected boundary lines;
   swapping two randomly selected sets of electronic components;
   moving one randomly selected component from a first randomly selected set of electronic components to a second randomly selected set of electronic components; or
   changing a ratio of a randomly selected boundary line to a random value between 0 and 1.

6. A system comprising:
   a memory comprising instructions executable by one or more processors; and
   the one or more processors coupled to the memory and operable to execute the instructions, the one or more processors being operable when executing the instructions to:
   create a layout for a Printed Circuit Board (PCB), comprising:
      create n boundary lines at n locations, respectively, on the PCB; and
      randomly place n sets of electronic components on the n boundary lines, respectively; and
   iteratively adjust and evaluate the layout of the PCB until a set of layout requirements for the PCB has been satisfied, and
   wherein for iteratively evaluating the layout of the PCB, each iteration comprises:
   computing a cost of the layout of the PCB based on the set of layout requirements;
   generating, by a random value generating function, a random value;
   computing a value to evaluate a currently best layout of the PCB, the value computed based on at least a cost of the currently best layout of the PCB and a current temperature controlling the iterative process; and
   if the random value is less than the value, then:
      setting the currently best layout of the PCB as the layout of the PCB; and
      setting the cost of the currently best layout of the PCB as cost of the layout of the PCB.

7. The system of claim 6, wherein the one or more processors are further operable when executing the instructions to represent the layout of the PCB with a Slicing Tree.

8. The system of claim 6, wherein the one or more processors are further operable when executing the instructions to represent the layout of the PCB with a Polish Expression or Reverse Polish Expression.

9. The system of claim 6, wherein iteratively adjusting and evaluating the layout of the PCB is based on Simulated Annealing, such that the iterative process is controlled by a temperature, comprising:
   set the temperature to an initial value;
   decrease the temperature by a step value during each iteration; and
   end the iterative process when the temperature reaches a final value.

10. The system of claim 6, wherein for iteratively adjusting the layout of the PCB, each iteration comprises randomly performing one of:
   swap two randomly selected boundary lines;
   swap two randomly selected sets of electronic components;
   move one randomly selected component from a first randomly selected set of electronic components to a second randomly selected set of electronic components; or
   change a ratio of a randomly selected boundary line to a random value between 0 and 1.

11. One or more computer-readable non-transitory storage media embodying software operable when executed by one or more computer systems to:
   create a layout for a Printed Circuit Board (PCB), comprising:
      create n boundary lines at n locations, respectively, on the PCB; and
      randomly place n sets of electronic components on the n boundary lines, respectively; and
   iteratively adjust and evaluate the layout of the PCB until a set of layout requirements for the PCB has been satisfied, and
   wherein for iteratively evaluating the layout of the PCB, each iteration comprises:
   compute a cost of the layout of the PCB based on the set of layout requirements;
   generate, by a random value generating function, a random value;
   compute a value to evaluate a currently best layout of the PCB, the value computed based on at least a cost of the currently best layout of the PCB and a current temperature controlling the iterative process; and if the random value is less than the value, then:
    set the currently best layout of the PCB as the layout of the PCB; and
    set the cost of the currently best layout of the PCB as cost of the layout of the PCB.

12. The media of claim 11, wherein the software is further operable when executed by the one or more computer systems to represent the layout of the PCB with a Slicing Tree.

13. The media of claim 11, wherein the software is further operable when executed by the one or more computer systems to represent the layout of the PCB with a Polish Expression or Reverse Polish Expression.

14. The media of claim 11, wherein iteratively adjusting and evaluating the layout of the PCB is based on Simulated Annealing, such that the iterative process is controlled by a temperature, comprising:
    set the temperature to an initial value;
    decrease the temperature by a step value during each iteration; and
    end the iterative process when the temperature reaches a final value.

15. The media of claim 11, wherein for iteratively adjusting the layout of the PCB, each iteration comprises randomly performing one of:
    swap two randomly selected boundary lines;
    swap two randomly selected sets of electronic components;
    move one randomly selected component from a first randomly selected set of electronic components to a second randomly selected set of electronic components; or
    change a ratio of a randomly selected boundary line to a random value between 0 and 1.

16. A system comprising:
means for creating a layout for a Printed Circuit Board (PCB), comprising:
    means for creating n boundary lines at n locations, respectively, on the PCB; and
    means for randomly placing n sets of electronic components on the n boundary lines, respectively; and
means for iteratively adjusting and evaluating the layout of the PCB until a set of layout requirements for the PCB has been satisfied, and
wherein, for each iteration, the means for iteratively evaluating the layout of the PCB comprises:
means for computing a cost of the layout of the PCB based on the set of layout requirements;
means for generating, by a random value generating function, a random value;
means for computing a value to evaluate a currently best layout of the PCB, the value computed based on at least a cost of the currently best layout of the PCB and a current temperature controlling the iterative process; and
if the random value is less than the value, then:
    means for setting the currently best layout of the PCB as the layout of the PCB; and
    means for setting the cost of the currently best layout of the PCB as cost of the layout of the PCB.

\* \* \* \* \*